United States Patent
Roberts et al.

(10) Patent No.: US 6,749,996 B2
(45) Date of Patent: *Jun. 15, 2004

(54) PUFF HEAT TRANSFER

(75) Inventors: Christopher Roberts, Blacklick, OH (US); Lawrence Levine, Blacklick, OH (US)

(73) Assignee: Impulse Wear, Inc., Blacklick, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/960,076

(22) Filed: Sep. 21, 2001

(65) Prior Publication Data

US 2002/0119308 A1 Aug. 29, 2002

Related U.S. Application Data

(63) Continuation-in-part of application No. 09/784,531, filed on Feb. 15, 2001, now Pat. No. 6,544,370, which is a continuation-in-part of application No. 09/413,519, filed on Oct. 6, 1999, now Pat. No. 6,232,041.

(60) Provisional application No. 60/103,274, filed on Oct. 6, 1998.

(51) Int. Cl.$^7$ ................................. B41M 1/12
(52) U.S. Cl. ................. 430/301; 430/306; 430/308; 428/195; 428/307; 101/114; 101/115; 101/123; 101/129; 101/491; 101/492
(58) Field of Search .................. 430/308, 301, 430/306; 428/195, 307; 101/115, 129, 123, 114, 491, 492

(56) References Cited

U.S. PATENT DOCUMENTS

| | | | |
|---|---|---|---|
| 4,092,456 A | 5/1978 | Newman et al. | |
| 4,255,217 A | * 3/1981 | Franze | 156/209 |
| 4,277,427 A | * 7/1981 | Kaminski et al. | 264/45.5 |
| 4,482,598 A | 11/1984 | Ishii et al. | |
| 4,789,621 A | 12/1988 | Knoth | |
| 4,844,849 A | * 7/1989 | Miller et al. | 264/46.4 |
| 4,971,644 A | 11/1990 | Mahn, Sr. et al. | |
| 5,136,938 A | 8/1992 | Pellegrina | |
| 5,196,237 A | * 3/1993 | May | 427/288 |
| 5,372,506 A | 12/1994 | Hambright | |
| 5,573,834 A | 11/1996 | Stahl | |
| 5,590,600 A | 1/1997 | Hale et al. | |
| 5,653,166 A | 8/1997 | Mohammed et al. | |
| 5,667,614 A | 9/1997 | Stahl | |
| 5,908,000 A | 6/1999 | Spychalla et al. | |
| 6,004,419 A | 12/1999 | Torii | |
| 6,087,061 A | 7/2000 | Hare et al. | |
| 6,092,464 A | * 7/2000 | Meola et al. | 101/129 |
| 6,105,502 A | 8/2000 | Wagner et al. | |
| 6,232,041 B1 | 5/2001 | Roberts et al. | |
| 6,348,939 B1 | 2/2002 | Xu et al. | |
| 6,402,313 B1 | 6/2002 | Xu et al. | |
| 6,488,370 B2 | * 12/2002 | Hale et al. | 347/100 |
| 6,544,370 B1 | 4/2003 | Roberts et al. | |
| 2002/0000288 A1 | * 1/2002 | Boyd et al. | 156/240 |

OTHER PUBLICATIONS

Hackh's Chemical Dictionary, 3$^{rd}$ Ed. Ed. Julius Grant. New York: McGraw–Hill Book Company, Inc., 1944. p. 127.*

* cited by examiner

Primary Examiner—Mark Huff
Assistant Examiner—Barbara Gilliam
(74) Attorney, Agent, or Firm—Taft, Stettinius & Hollister LLP

(57) ABSTRACT

The present invention is a puff heat transfer, a puff transfer composition, and a method of making a puff transfer composition. The puff transfer composition, i.e., ink, is actually loaded with the color. In particular, the transfer composition comprises effective amounts of a transfer base material, at least one pigment concentrate, and a puff base material. The transfer base material and the pigment concentrate may be mixed together and then loaded into the puff base material to form the transfer composition. The transfer composition may be deposited on a transfer sheet to make the heat transfer. The transfer sheet may be a substrate that is treated with QUILLON™. By using a substrate sheet that is treated with QUILLON™, the puff of the present invention has an improved, velvet-like feel when the transfer sheet is removed.

27 Claims, 15 Drawing Sheets

PUFF HEAT TRANSFER

This is a continuation-in-part of U.S. application Ser. No. 09/784,531, filed Feb. 15, 2001, now U.S. Pat. No. 6,544,370, which was a continuation-in-part of U.S. application Ser. No. 09/413,519, filed Oct. 6, 1999, now U.S. Pat. No. 6,232,041, which claimed the benefit of U.S. Provisional Application No. 60/103,274, filed Oct. 6, 1998. The entirety of U.S. Pat. No. 6,232,041, U.S. Pat. No. 6,544,370, U.S. application Ser. No. 09/784,531, and U.S. application Ser. No. 09/413,519 are hereby incorporated by reference.

BACKGROUND AND SUMMARY OF THE INVENTION

The present invention relates generally to methods and apparatuses for reproducing art on heat transfers that are applied to clothing and other items. More particularly, the present invention relates to heat transfers and transfer compositions for creating improved puff images.

Conventional transfer technologies typically use one of three processes to create a transfer image for a heat transfer. The first process is the spot color or block color process, in which each actual color in the artwork is printed. This process generally is not cost-effective due to the number of ink colors required and has a number of disadvantages. Resolution is low, only a limited number of colors are available, and there is a limited ability to achieve gradations in color. Also, half-tones cannot be used, but rather only solid blocks of color. Consequently, this process is generally suitable only for simple designs.

The second process is the clear carrier or Trans-Art process. The clear carrier process uses a clear carrier layer and translucent inks. The inks used with the clear carrier process are the four-color or CMYK ink pallets. Colored inks are applied to the carrier layer in the following order: 1. red, 2. black, 3. blue, and 4. yellow. A white highlight layer is then applied.

The third conventional process creates opaque transfers using half-tones. However, the resulting opaque transfers have low resolution, low color values, and poor color reproduction.

Additionally, recent direct printing technologies include use of unlimited color pallets. Software is available for use by direct printers that allows printing of high-resolution, full-color, photographic images. The software scans in an image, selects ink colors from a library, and prepares color separations that show which portions of a screen will have a particular color applied to them and which will not.

Direct printers generally apply a solid white base layer first, then up to eight translucent colors, generally in the following order: red, blue, purple, gold, green, turquoise, gray, brown, white (highlight), and black. Commercial software is available to assist direct printers in obtaining color separations and color densities from scanned-in artwork.

Direct printing technology is not suitable for printing transfers. Transfers are printed in reverse color order so that the correct image appears on the substrate to which the transfer is applied. Transfers also must be printed so the desired arrangement of colors appears at the ink split rather than the upper surface of the transfer sheet.

In addition to the above shortcomings, conventional puff heat transfers have further drawbacks. In a conventional puff heat transfer, color is not loaded into the puff material. Instead, a plastisol ink color is first applied to the transfer sheet. Thereafter, a clear or neutral puff material is applied on top of the plastisol ink color. Consequently, the color is influenced by the clear or neutral puff material when the image is transferred to a piece of clothing or any other item. This can result in a dull and unappealing image.

Conventional puff heat transfers also fail to provide a desired feel. These puff heat transfers commonly use paper that is not adequately treated as the transfer sheet. Consequently, when the transfer sheet is removed, it also tears away some of the puff material. This leads to a puff image that feels somewhat rough.

In light of the above shortcomings, one aspect of the present invention contemplates a new and improved method for making heat transfers with opaque inks which is simple in design, effective in use, and overcomes at least some of the foregoing difficulties and others while providing better and more advantageous overall results. Furthermore, the present invention provides puff transfer compositions having improved characteristics including, but not limited to, washing characteristics and printing characteristics.

In accordance with one embodiment of the present invention, a new and improved method for reproducing fine art on heat transfers that are applied to clothing and other items is provided which creates high quality transfers.

According to one aspect of the present invention, a method of making a heat transfer from an image for application to a T-shirt or other piece of cloth is disclosed. The method includes the steps of scanning the image to create a computer image represented by a computer readable image file; separating the computer image into a plurality of colors using a computer to create a separated image; creating a plurality of plates from the separated image; each of the plurality of plates corresponding to one of the plurality of colors; printing each of the plurality of plates on film to create a plurality of color separation films; the color separation films having printed matter corresponding to one of the plurality of colors; treating a plurality of mesh screens with a photoemulsion; placing the plurality of color separation films on the plurality of mesh screens; applying light to the mesh screens, a portion of the photoemulsion hardening in the light and a second portion of the photoemulsion covered by the printed matter on the color separation films remaining soft; washing the plurality of mesh screens to remove the second portion of the photoemulsion; and applying ink to a piece of transfer paper through the plurality of mesh screens.

One advantage of the present invention is that bright, opaque transfers are created that may be applied to dark color shirts. Another advantage of the present invention is that the images created on the heat transfers look nearly identical to the original artwork. Yet another advantage of the present invention is that a wide range of colors may be achieved using a reasonable (cost-effective) number of ink color layers.

Another embodiment of the present invention is a transfer composition that loads the color into the puff material. In this embodiment, the transfer composition comprises a puff base material and at least one pigment concentrate. The puff base material is included in an amount of at least about 85% by weight. On the other hand, the pigment concentrate is in a total amount of about 15% by weight or less. Consequently, this feature of the present improves the color quality of images that can be applied by puff heat transfers.

Another embodiment of the puff transfer composition of the present invention is also loaded with the color. This exemplary transfer composition comprises a transfer base material, at least one pigment concentrate, and a puff base material. The transfer base material may be included in amount of at least about 25% by weight, and the puff base material may be included in an amount of at least about 35% by weight. On the other hand, the pigment concentrate may be in a total amount of about 40% by weight or less. The transfer base material and the pigment concentrate may be mixed together and then loaded into the puff base material to form the transfer composition. Exemplary embodiments of this transfer composition offer significantly improved printing and washing characteristics while still being effective for making high color quality puff transfers.

The present invention includes still another embodiment of the puff transfer composition that is loaded with the color. This exemplary transfer composition also comprises a transfer base material, at least one pigment concentrate, and a puff base material. The transfer base material may be included in amount of at least about 25% by weight, and the puff base material may be included in an amount of at least about 65% by weight. On the other hand, the pigment concentrate may be in a total amount of about 10% by weight or less. The transfer base material and the pigment concentrate may be mixed together and then loaded into the puff base material to form the transfer composition. Exemplary embodiments of this transfer composition offer significantly improved printing and washing characteristics while still being effective for making high color quality puff transfers.

The present invention is not limited to the exemplary embodiments of the puff transfer composition that are noted above. The present invention includes all other variations of the puff transfer composition that include effective amounts of transfer base material, at least one pigment concentrate, and puff base material. As used herein, a puff transfer composition includes effective amounts of the ingredients if it is suitable for making heat transfers.

The present invention also includes a puff transfer. In this aspect of the present invention, the transfer comprises an ink image on a substrate sheet. The sheet of substrate is treated with QUILLON™ (a stearato-chromic chloride complex release coating), and the ink image is made of a transfer composition, e.g., a puff transfer composition of the present invention or any other similar, suitable, or conventional puff or non-puff composition. By using a substrate sheet that is treated with QUILLON™, the inventors have surprisingly discovered that a puff transfer has an improved, velvet-like feel when the transfer sheet is removed. This beneficial effect is due to the improved release of the pigment concentrate by the QUILLON™-treated paper.

The present invention also includes a method of making a puff image on an article. The method comprises the steps of making a transfer composition, e.g., a puff transfer composition of the present invention or any other similar, suitable, or conventional puff transfer composition. The transfer composition is deposited on a substrate to form a transfer which is then positioned on an article. Heat and pressure are applied to the substrate to transfer the transfer composition onto the article, and the transfer composition is adapted to puff. This embodiment of the present invention can further include any of the optional or preferred embodiments of the present invention.

In addition to the novel features and advantages mentioned above, other objects and advantages of the present invention will be readily apparent from the following descriptions of the drawings and exemplary embodiments.

BRIEF DESCRIPTION OF THE DRAWINGS

The invention may take physical form in certain parts and arrangement of parts, a preferred embodiment of which will be described in detail in this specification and illustrated in the accompanying drawings that form a part of this document.

DETAILED DESCRIPTION OF EXEMPLARY EMBODIMENT(S)

Figure 1:
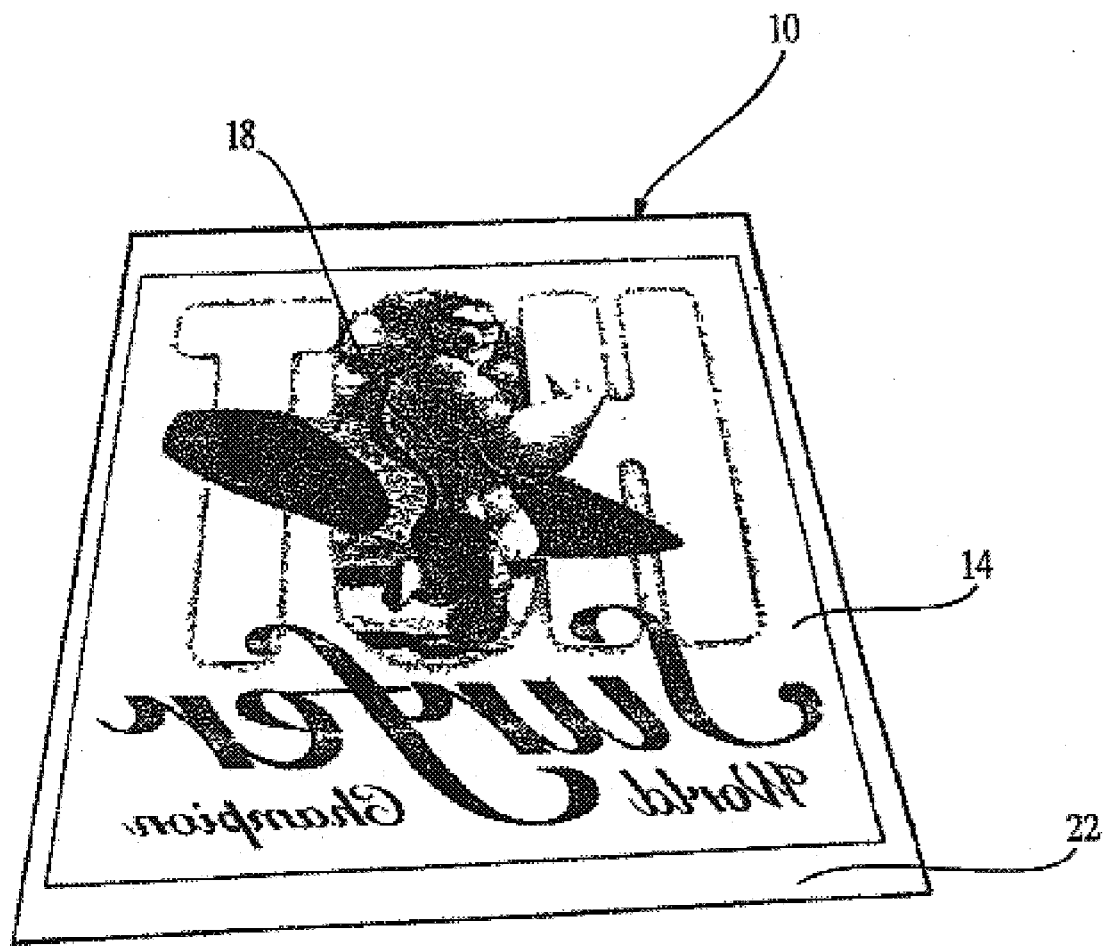
FIG. 1 shows a perspective view of a heat transfer.

The present invention is directed to heat transfers and transfer compositions. The present invention also includes methods of making and applying heat transfers. The heat transfers of the present invention can be applied to any desired items. For instance, the heat transfers can be used with articles that are known to receive transfers including, but not limited to, fabric items such as clothing, luggage, bags, backpacks, and other similar, suitable, or conventional materials.

The transfers are made in two general steps, a pre-press step in which screens are prepared for printing the transfers and a printing step in which ink is applied to transfer paper through the screens. Referring now to the drawings which show an example of one embodiment of the invention, FIGS. 1 through 5 concern the application of opaque inks for reproducing art on a heat transfer 10. A heat transfer 10 includes an image 14 created with ink 18 and applied to heat transfer sheet 22. When a heat source is applied to a heat transfer 10, the ink 18 is transferred from the heat transfer sheet 22 to a piece of fabric (not shown) on which the heat transfer 10 is placed, such as a T-shirt.

The first step of the process for producing the improved heat transfer 10 is the selection of the image 14. After the image is selected, the image 14 may be scanned into a computer. In the preferred embodiment, the image 14 is scanned as a RGB tiff file, which differs from other printing methods. The scanned image is then preferably color corrected and digitally altered, or "cleaned up," to match the original image 14. Throughout the entire process, the image 14 is maintained in the RGB format. When the altered, scanned image is closely matched to the original image, the next step of the process may include the separation of colors.

Figure 2:
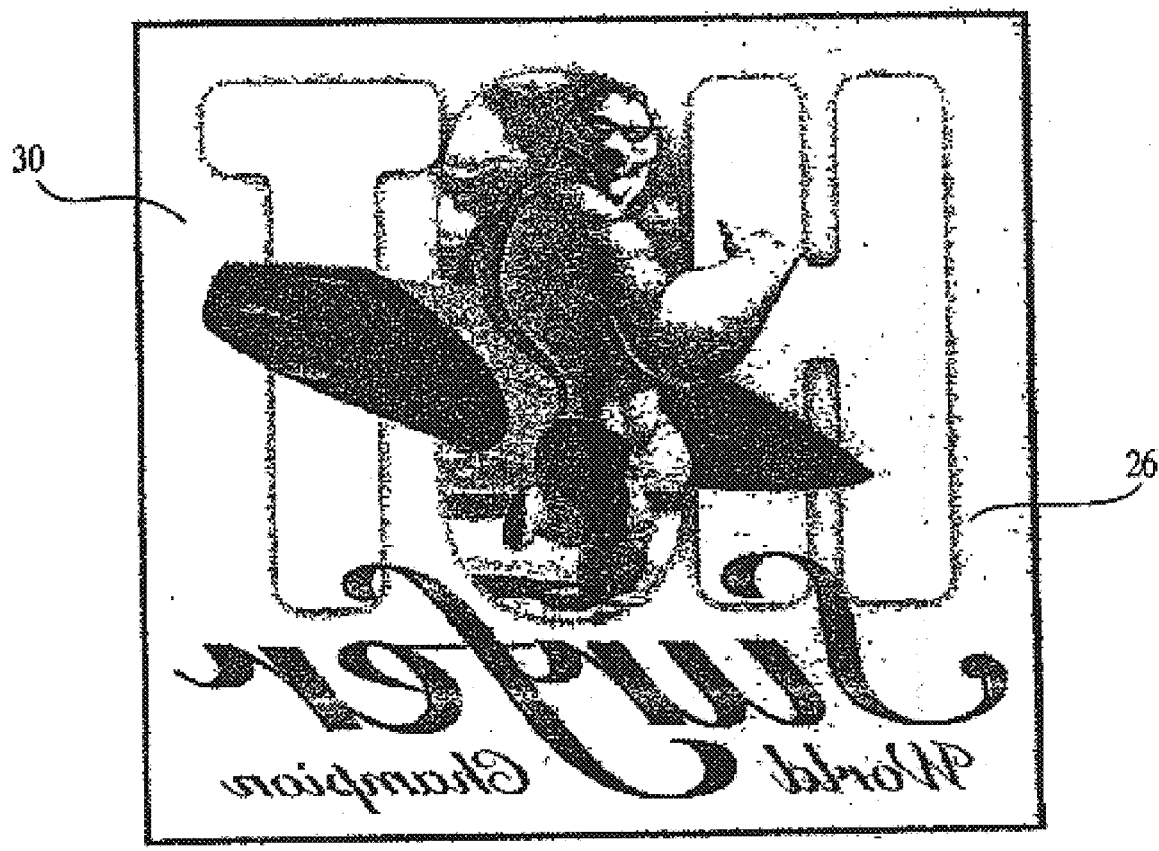
FIG. 2 shows a color separation plate.

A color separation may be prepared to separate the image colors into component ink colors. This is particularly useful when a complex image is desired that is comprised of many different variations of colors. The color separation process can be used to separate the image colors into component ink colors that, when combined, will yield a heat transfer image as close as possible to the altered scanned image. The ink colors are preferably selected so the best and brightest colors are the exact colors that are printed based on the selection of inks, and not the colors that require a combination of inks, thereby producing the best overall results. Superior results are obtained with images that contain the colors white, blue, red, gold, purple, green, turquoise, gray, black, and brown. FIG. 2 shows a color separation 26. Color separations 26 may be half-tone printouts (made up of dots, like a newspaper photo) on a transparent film 34. The image 14 is separated into colors by selecting the area of the image 14 in which the color exists or the color is used to make another color. The printouts have dots in regions where a particular color is to be applied to the transfer 10. A different half-tone film is made for each ink color to be applied to the transfer. The computer assigns a particular ink color within a given color family from an ink library based on the color pallet and color densities using a standard direct printing software, such as a program called "Spot Process," which is produced by Freehand Graphics. As written, the software does not achieve a satisfactory result because of differences between direct printing and transfer manufacturing. Transfer inks must be applied in a different order than direct printing inks. In some instances, the transfer ink layers may also be thicker than direct print ink layers because the ink layer may be "split" when the transfer is applied. When the transfer is heated, a portion of the inks may adhere to the surface and a portion may remain on the transfer sheet depending on the release qualities of the transfer sheet. The ink "split" also affects color blending and shading. Knowledge about where in the ink layer this split will occur, which is a characteristic of the chosen inks, assists in obtaining finer gradations of color shading. Therefore, the standard software has been modified to alter the number and sequence of process steps to achieve satisfactory transfers. Specifically, the colors have been modified from being translucent to preferably up to 100% opaque and a white base is used to allow application of the transfer to a substrate of any color and to achieve desired resolution. Also, the print rotation has been reversed to reflect the fact that a transfer is a negative image rather than a positive image.

Figure 6:
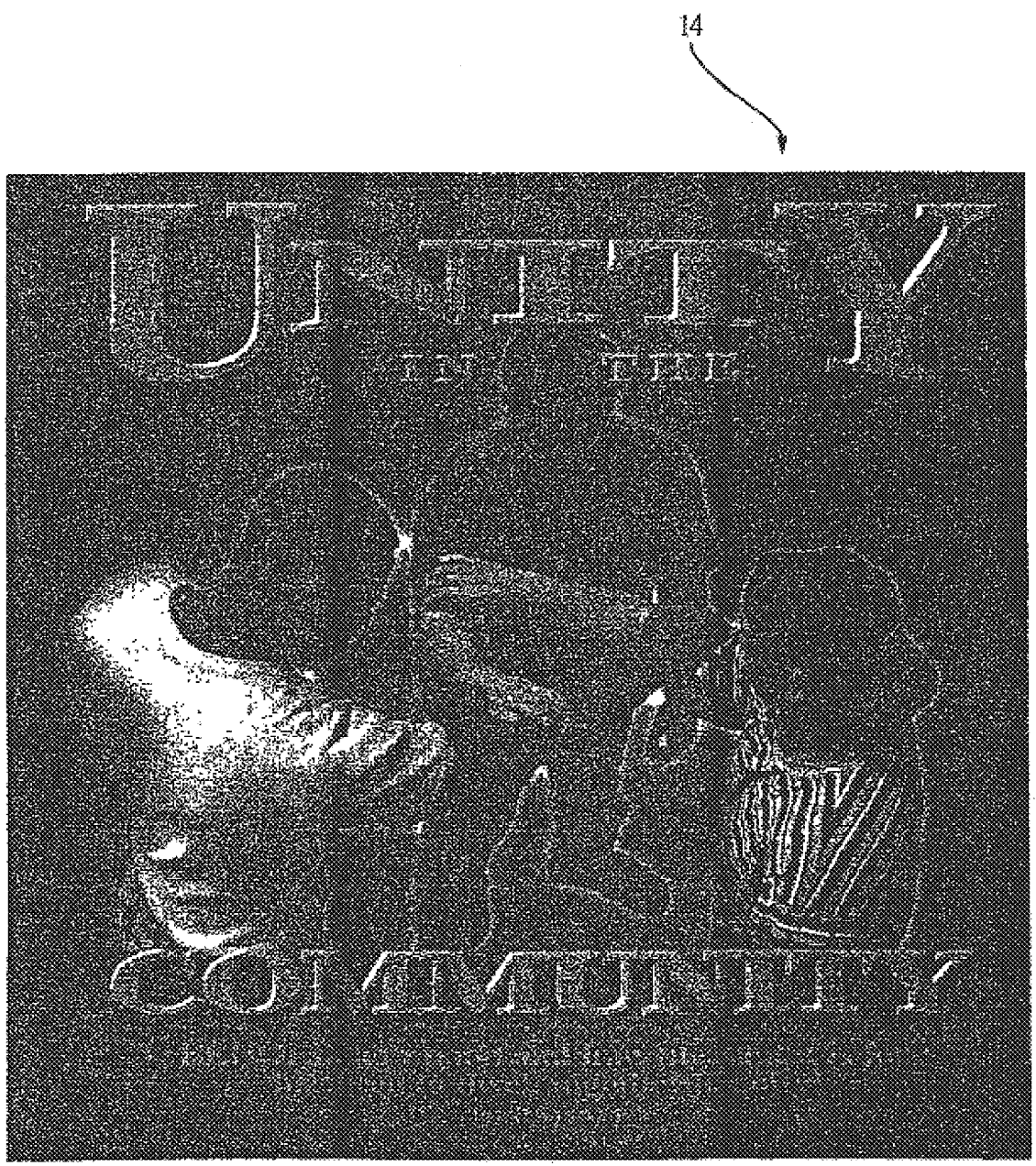
FIG. 6 shows an image.
Figure 7:
FIGS. 7–15 show color separations according to the present invention of the image of FIG. 6.
Figure 8:
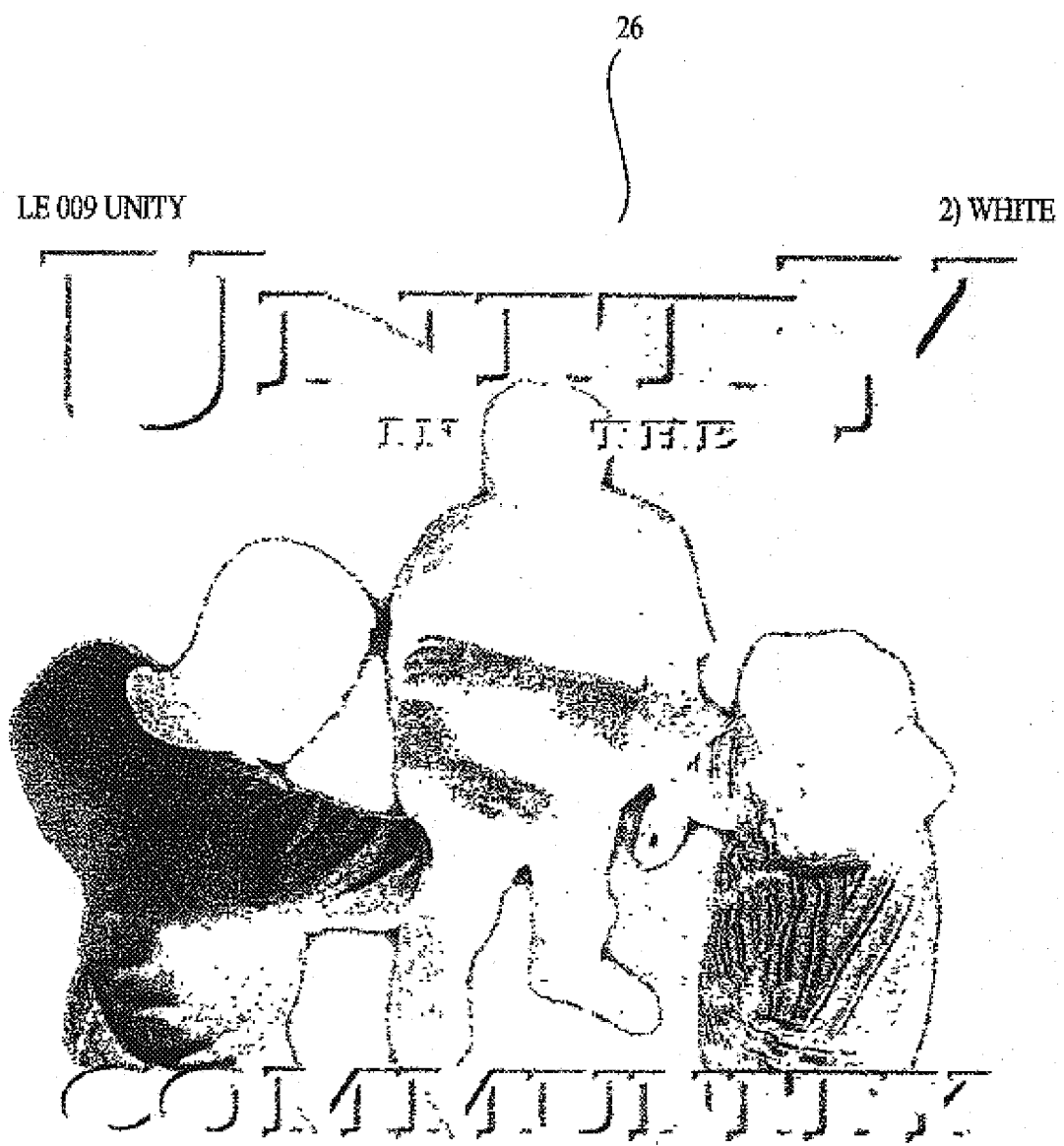
Figure 9:
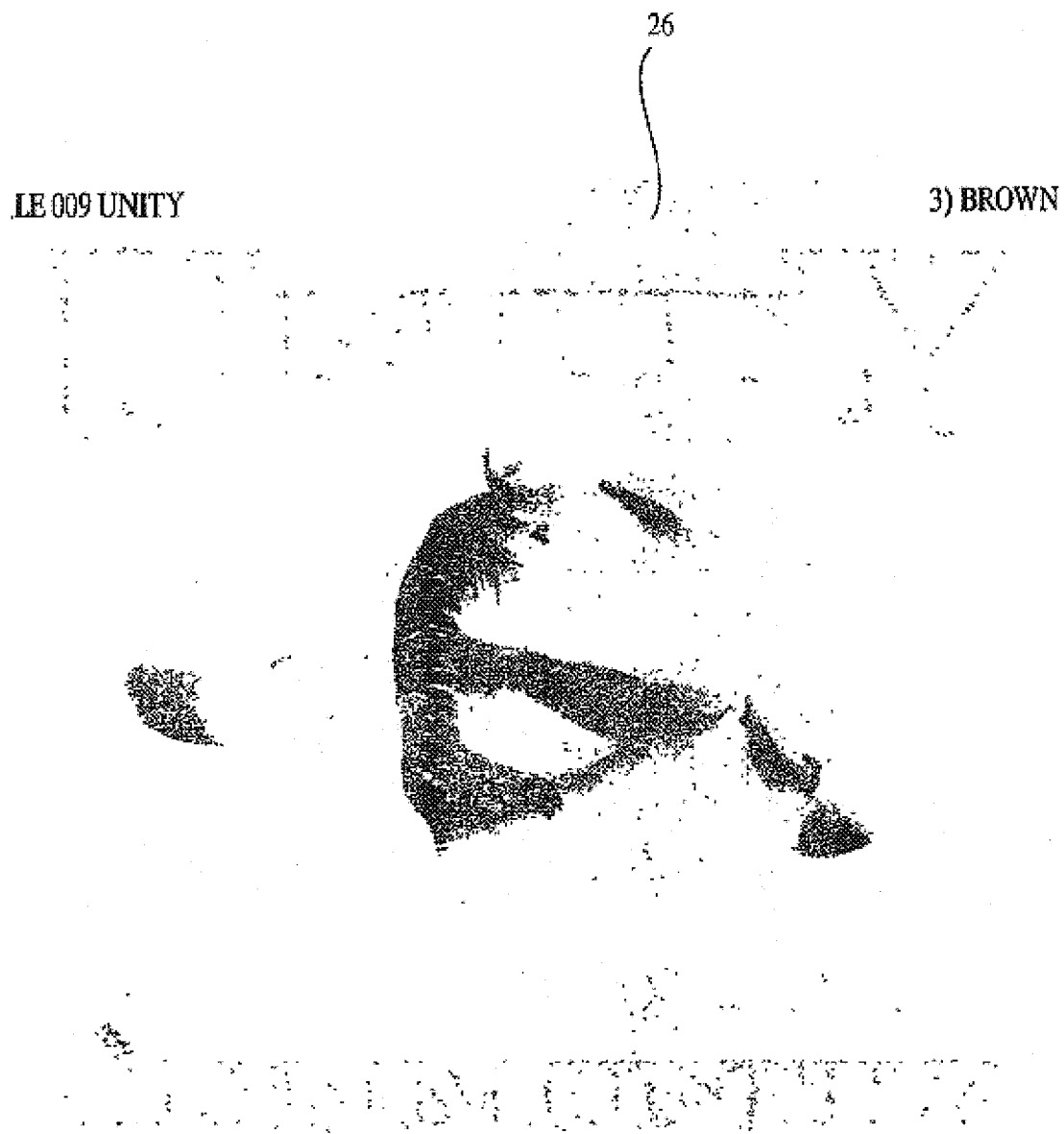
Figure 10:
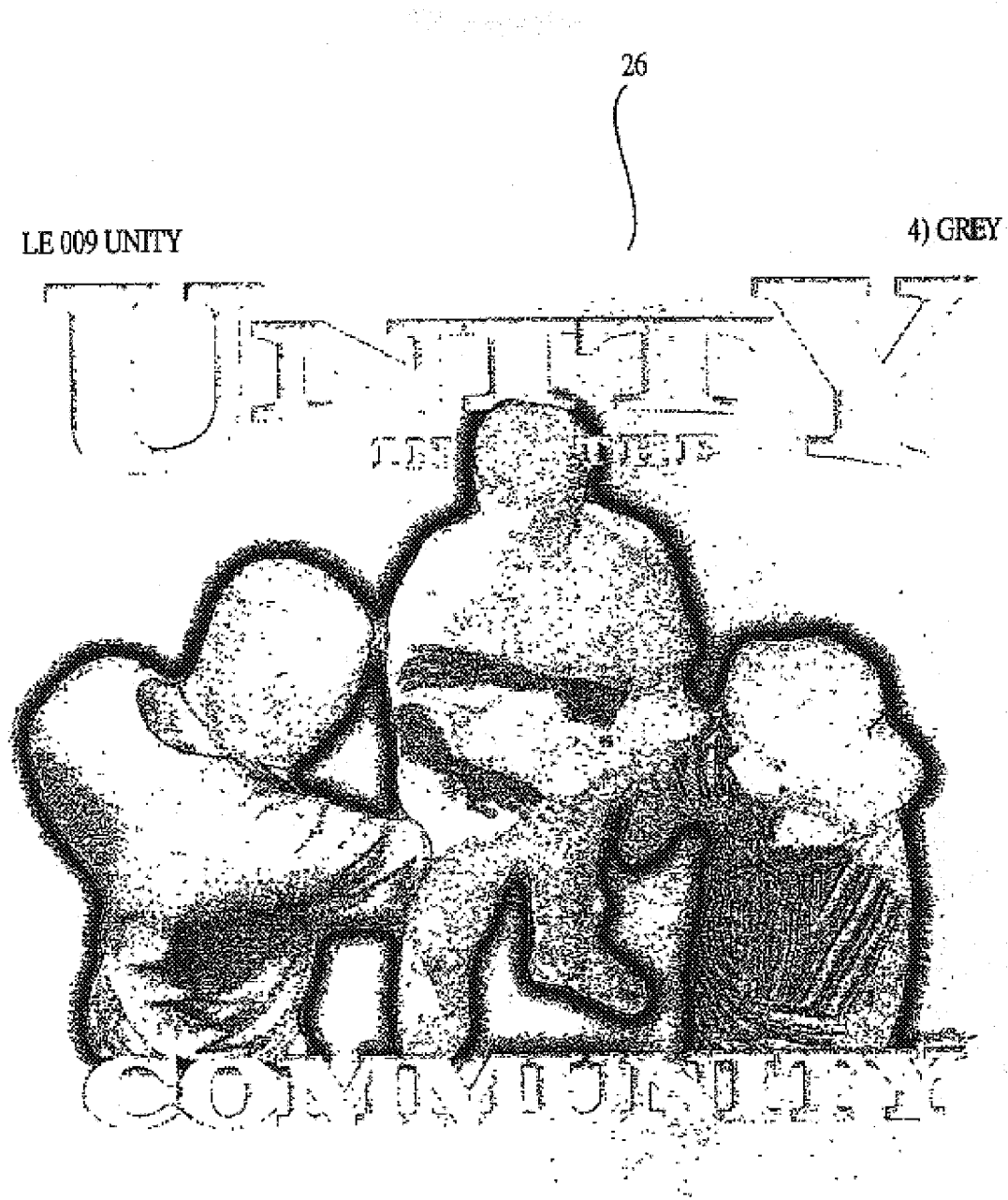
Figure 11:
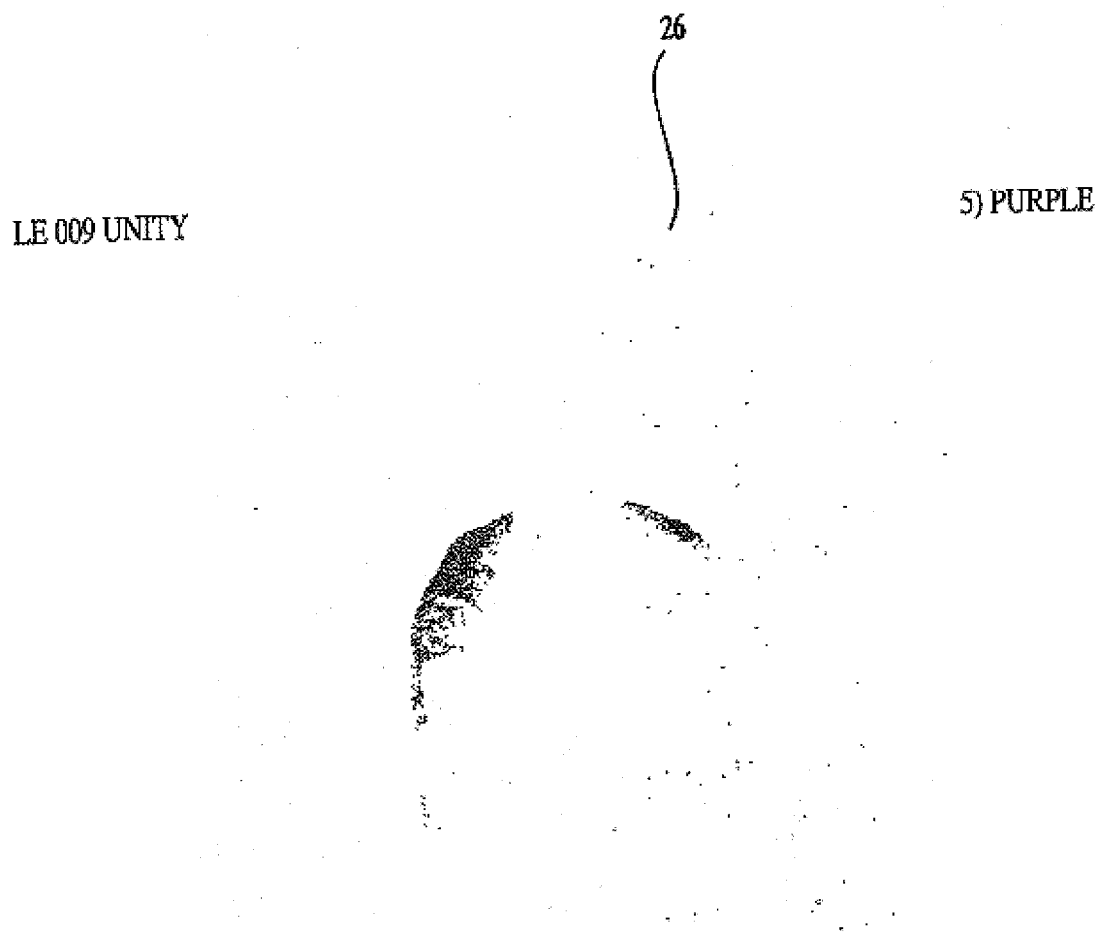
Figure 12:
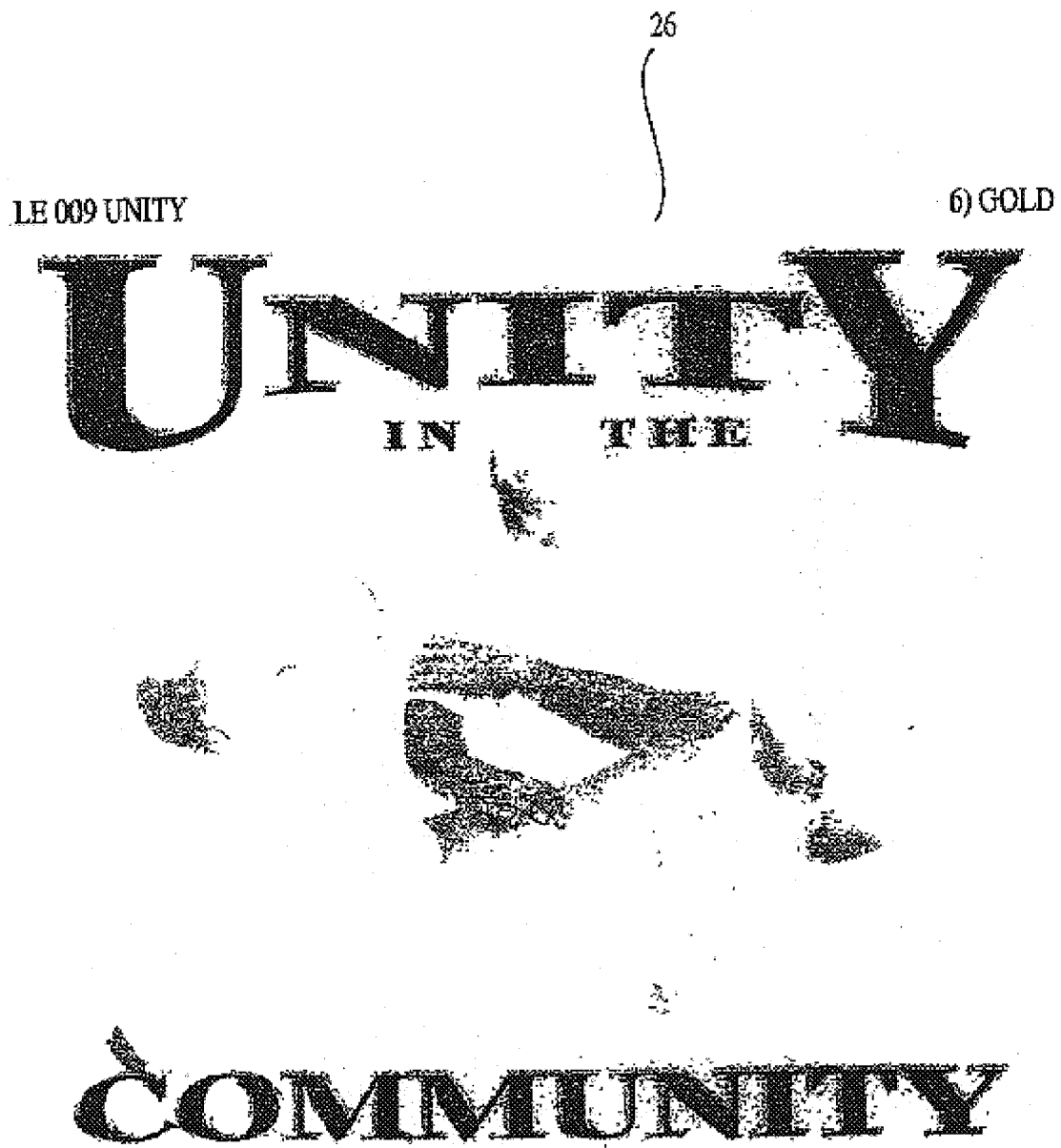
Figure 13:
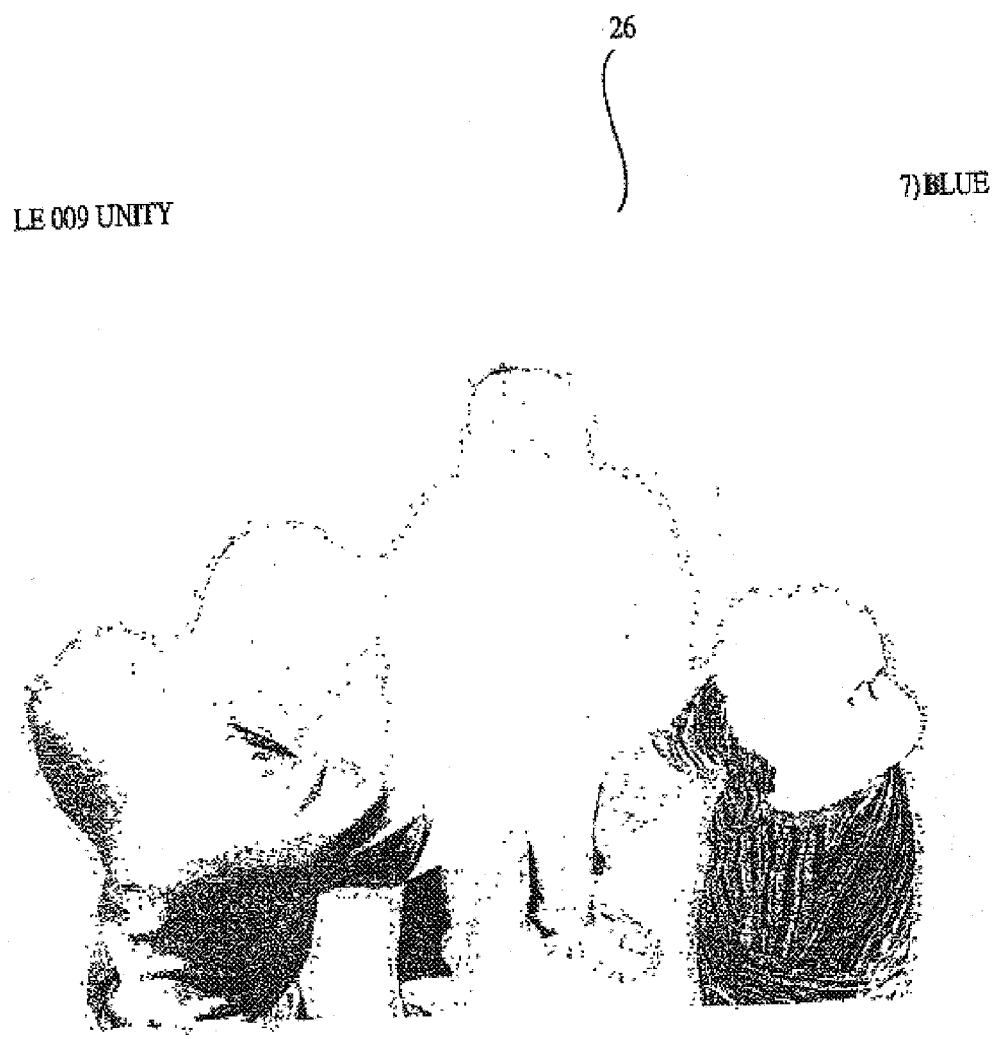
Figure 14:
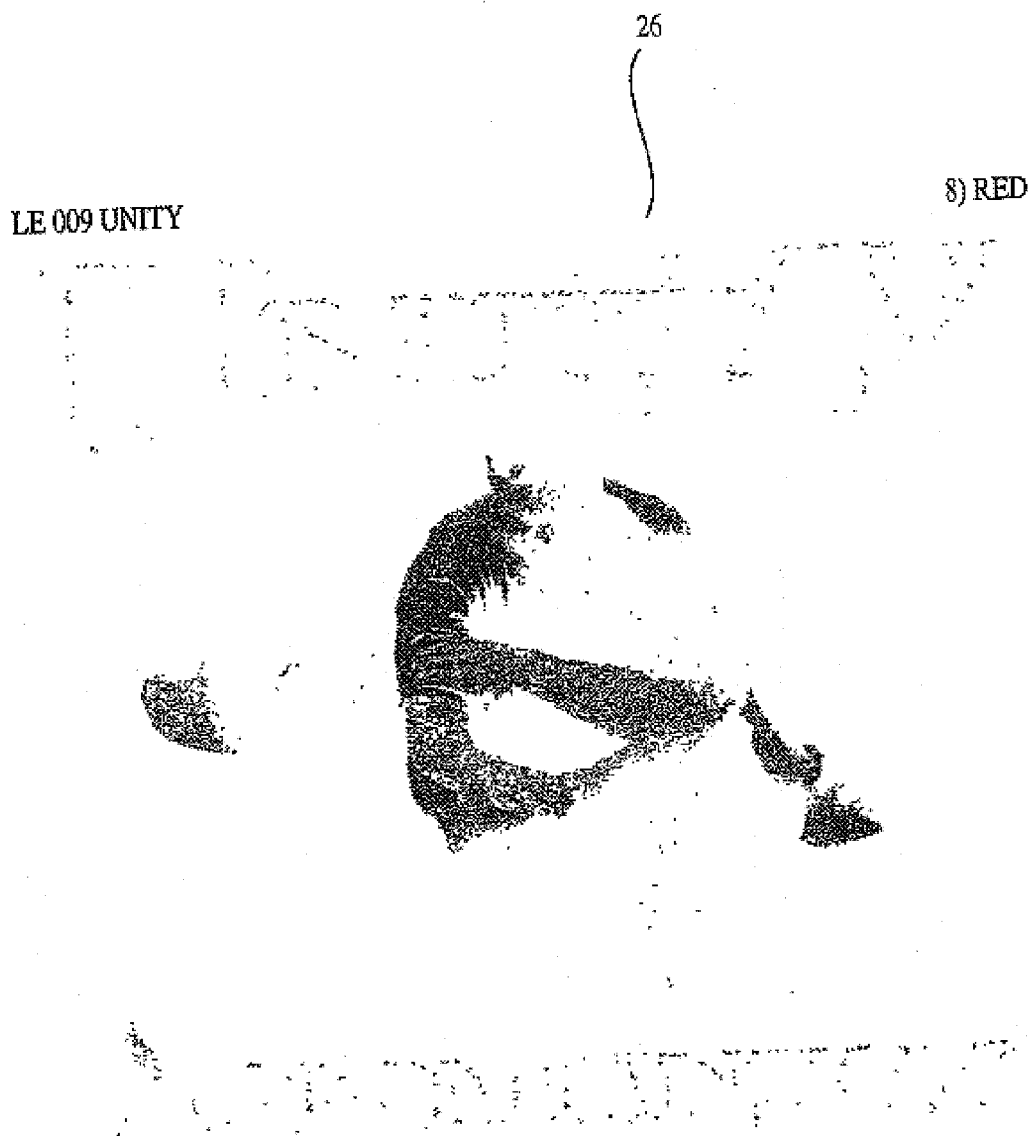
Figure 15:
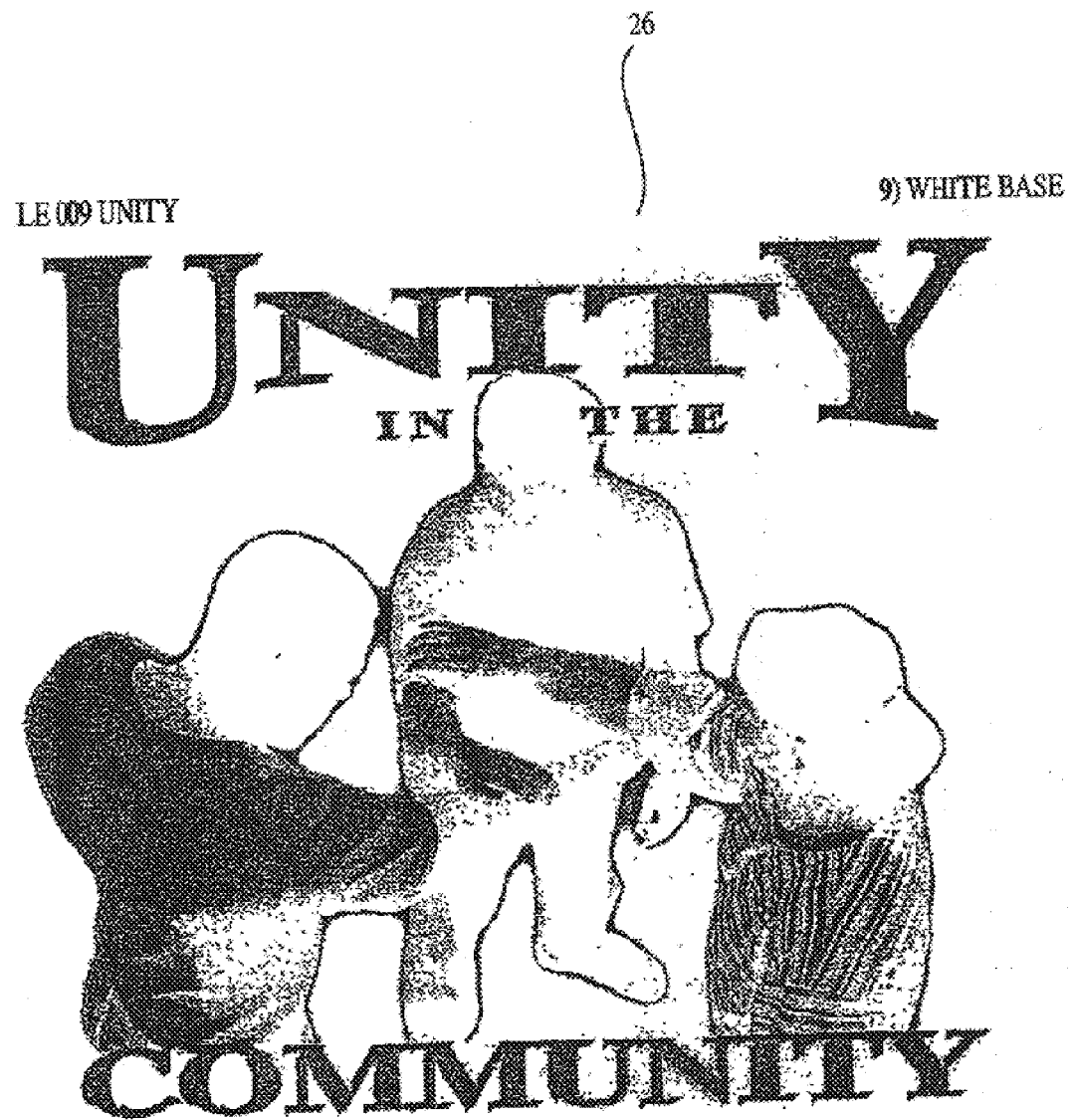

FIG. 6 shows an image 14. FIGS. 7 through 15 show color separations 26 of the image 14. In particular, FIG. 7 is black ink, FIG. 8 is white ink, FIG. 9 is brown ink, FIG. 10 is gray ink, FIG. 11 is purple ink, FIG. 12 is gold ink, FIG. 13 is blue ink, FIG. 14 is red ink, and FIG. 15 is white base.

First, a "white base" may be selected. This is the plate 30 that is printed to go behind all of the other colors to help make the design opaque and to help make lighter shades of other colors. The area is selected, and a plate or channel is printed of the selection. The result is a gray scaled plate of the selection that looks similar to a black and white photograph, as shown in FIG. 2.

Figure 3:
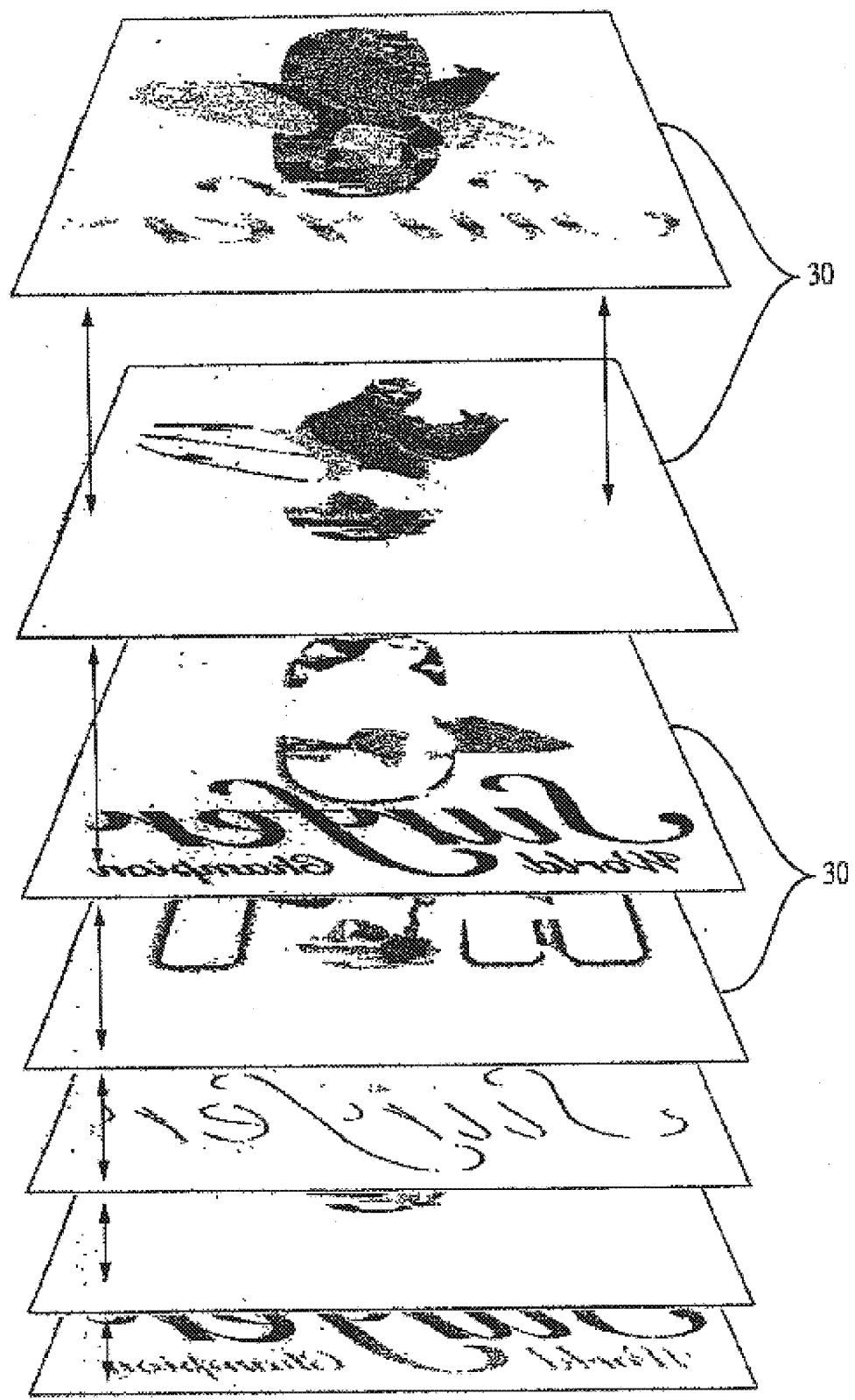
FIG. 3 shows a view of an overlay of several color separation plates.

For the second step, red may be selected. The area of the image that contains red or that needs red to create another color, such as pink, is selected. A plate 30 or channel is then created for the selection. The process continues for the remaining colors according to the printing order. As the plates are overlaid, as shown in FIG. 3, the illusion of more and different colors is created.

Figure 4:
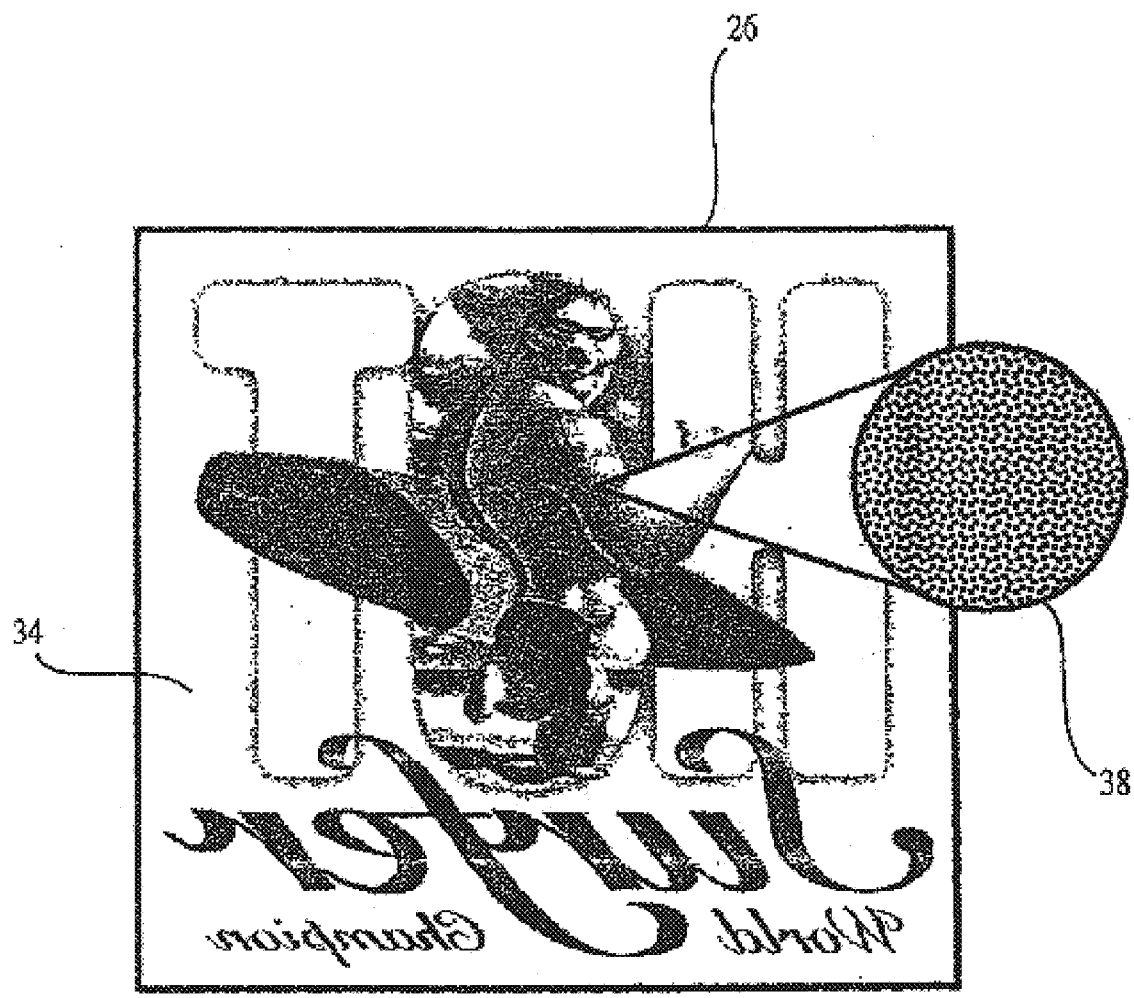
FIG. 4 shows a close-up view of a color separation printed on film.
Figure 5:
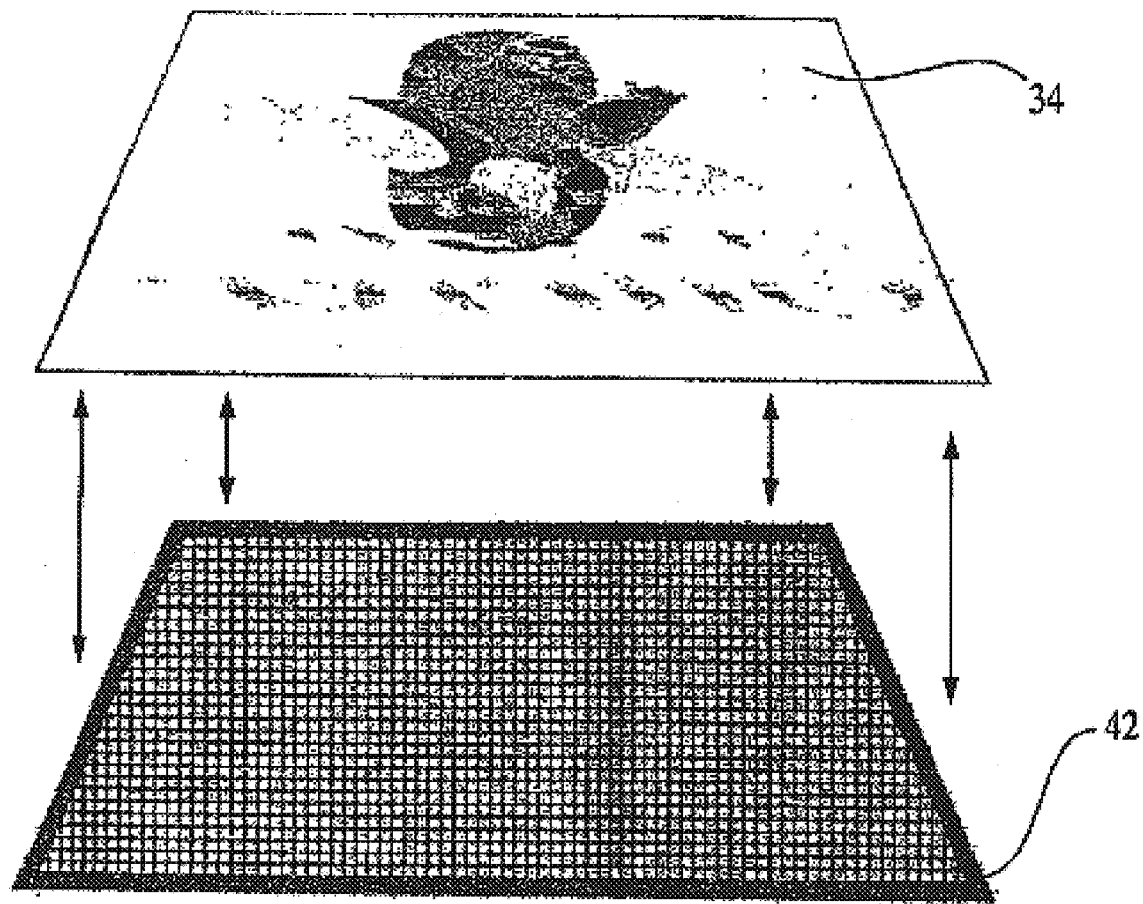
FIG. 5 shows a perspective view of a mesh screen with a color separation film.

The order the colors are printed is opposite of what a viewer actually sees because a transfer 10 is a negative image. For the pre-press work, the order of printing is white base, red, blue, gold, purple, green, turquoise, gray, white, black, and brown. The first white base is for opacity and shading. The second white is for bright white in the image 14. Brown is only used when needed, such as in the creation of flesh tones or when brown is part of the image. After all of the plates 30 are made, the image 14 is viewed with the plates 30 together so that they cover completely and produce a multi-colored, opaque image 14. When the image is satisfactory, the plates are separated and printed on film 34. All printing is made of dots 38 which lay on top of each other or next to each other with half-tone inks. The printing of dots 38 for this method lay next to each other and are printed 45 lines per inch. A close-up view of a separation 26 printed on film 34 is shown in FIG. 4.

The color separation films 34 with half-tones are placed on a mesh screen 42 to which a light-sensitive photoemulsion has been applied. The mesh 42 may be made of polyester, nylon, or a combination of these, with openings of a desired size. An example of the mesh screen 42 is Saati 40 T mesh which is commercially available from Saati. This example of the mesh is a monofilament polyester. On the other hand, an example of the photoemulsion is Marathon Z which is commercially available from Majestech. Marathon Z is a dual cure photopolymer having a 40% solids content. Generally, the finer the mesh 42, the finer the resolution and shading possible. Conversely, a coarser mesh 42 may be used for images that require a lower degree of resolution. When making a puff transfer, a relatively coarse mesh 42 may be used to improve the puff characteristics, e.g., the millage (i.e., thickness) of the puff. The screen 42 is exposed to light, such as ultraviolet (UV) light, causing the photoemulsion to harden in the areas without half-tones. The emulsion remains soft in the areas under the half-tones because the light did not penetrate through the half-tones. The soft emulsion is removed by rinsing, thereby leaving open mesh areas through which ink 18 will be applied to the transfer sheet 22. The hardened emulsion forms a seal over the mesh perforations in other areas. A different screen 42 is prepared for each color to be applied. Stretching of the mesh 42 so that it exposes properly is important in obtaining good resolution.

The inks 18 are applied in a different order than a direct printer would apply ink. In an exemplary embodiment, the order of application is: black, white highlight, brown, gray, turquoise, green, gold, purple, blue, red, and white. A direct printer generally requires additional ink layers (one black and one white) compared to a transfer manufacturer. It is possible to make a transfer 10 without using all of these colors for relatively simple art, but use of all of these colors may be necessary to make a realistic, photographic quality multi-color transfer image.

Conventional machinery is used to apply ink 18 to the transfer page through the screens 42 in a predetermined order. For areas of the image that require a combination of colors, this process builds up the desired number of ink layers in the desired area. Registration (consistent alignment of the screens relative to the transfer paper on all runs) also is important in obtaining good resolution. Due to the nature of puff transfers, it is preferred to use only a single layer of ink 18 to achieve the desired colors of the image. However, it should be recognized that a puff transfer may also employ stacked ink layers to achieve a desired result.

The transfer sheet 22 used in making the transfer 10 must provide stable retention of ink 18 on the sheet 22 until the transfer 10 is applied and facilitate release of the ink 18 during application. If the sheet 22 releases ink 18 too easily, the ink 18 can practically be moved on the transfer 10 by blowing on it, which would result in an image 14 that is blurry. On the other hand, if the sheet 22 does not release ink 18 easily enough, it will be difficult to cleanly transfer the image 14 from the sheet 22 to an article. An example of the sheet 22 is a total release paper that is treated with photopolymer silicone. In this embodiment, the sheet 22 may allow the ink 18 to split with approximately 90–95% of the ink 18 being released from the sheet 22 when heated in the traditional method. The increased release of ink 18 from the sheet 22 over a non-treated paper, which releases about 50% of the ink, helps the released ink 18 to maintain a high level of opacity. The amount of ink 18 released from the sheet 22 may vary depending on how even the ink 18 was originally applied and the evenness of the silicone coating on the sheet 22.

Another example of the sheet 22 is a substrate that is treated with QUILLON™ or a similar chemical. An example of a QUILLON™-treated substrate is Burkhardt/Freeman 31×45 ultra strip smooth treated C25 65 pounds, lot number 39614, or any other similarly treated sheet. The substrate may be paper or any other substrate that is suitable for being treated or otherwise coated by the QUILLON™ or a similar chemical. The inventors have made the surprising discovery that using a QUILLON™-treated substrate results in even more improved release of the ink upon application. In particular, the QUILLON™-treated substrate can release up to substantially 100% of the ink from the substrate when heated in a conventional application process. The improved release can give the image, especially a puff transfer image, a velvet-like feel.

The ink 18 may be any brand of plastisol ink in non-puff embodiments of the present invention. Plastisol inks typically comprise a resin, polyvinyl chloride, and a coloring agent. Consistent ink properties are important in achieving acceptable results. The ink 18 preferably has a shear rate sufficient to provide the necessary opacity and acceptable ink split. The ink 18 also preferably has a viscosity that allows printing the desired number of lines per inch.

On the other hand, the ink 18 has different ingredients for puff heat transfers. In one embodiment, the ink 18 for puff heat transfers is comprised of a puff base material and at least one pigment concentrate. The puff base material and the pigment concentrate may be mixed together by any conventional or suitable method. The puff base material preferably comprises at least about 85%, more preferably at least about 90%, still more preferably at least about 92%, by weight of the ink 18. On the other hand, the total amount by weight of pigment concentrate is preferably about or less than 15%, more preferably about or less than 10%, and even more preferably about or less than 8%. However, it should be recognized that in optional embodiments of the present invention the puff base may account for less than about 85% by weight of the composition and the pigment concentrate may account for more than 15% by weight of the composition.

In another embodiment, the ink 18 for puff transfers is comprised of effective amounts of a transfer base material, at least one pigment concentrate, and a puff base material. The transfer base material, the pigment concentrate, and the puff base material may be mixed together in any order by any conventional or suitable method. Nevertheless, it has been discovered that the resultant transfer composition exhibits improved washing and printing characteristics when the transfer base material and the pigment concentrate are first mixed together and then loaded into the puff base material.

In one embodiment, the transfer base material may comprise at least about 25%, more preferably at least about 30%, still more preferably at least about 32%, even more preferably at least about 34%, by weight of the ink 18. On the other hand, the total amount by weight of pigment concentrate in this embodiment of the transfer composition may be about or less than 40%, more preferably about or less than 30%, still more preferably about or less than 25%, and even more preferably about or less than 20%. The puff base material may account for at least about 35%, more preferably at least about 40%, still more preferably at least about 43%, even more preferably at least about 46%, by weight of the ink 18 in this embodiment. Nevertheless, it should be recognized that some embodiments of the ink 18 of the present invention may comprise about 0% to about 25% by weight of the transfer base material, about 40% to about 100% by weight of the pigment concentrate, and/or about 0% to about 35% by weight of the puff base material. Four further exemplary embodiments of this puff transfer composition are provided below:

|  | % By Weight |
|---|---|
| Transfer Base Material | 25–52 |
| Pigment Concentrate | 0.1–40 |
| Puff Base Material | 35–68 |
| Transfer Base Material | 30–47 |
| Pigment Concentrate | 0.1–30 |
| Puff Base Material | 40–63 |
| Transfer Base Material | 32–45 |
| Pigment Concentrate | 0.1–25 |
| Puff Base Material | 43–60 |
| Transfer Base Material | 34–43 |
| Pigment Concentrate | 0.1–20 |
| Puff Base Material | 46–57 |

In another embodiment of the puff transfer composition, the transfer base material may be included in amount of at least about 25% by weight, and the puff base material may be included in an amount of at least about 65% by weight. On the other hand, the pigment concentrate may be in a total amount of about 10% by weight or less. Again, it should be recognized that some embodiments of the ink 18 of the present invention may comprise about 0% to about 25% by weight of the transfer base material, about 10% to about 100% by weight of the pigment concentrate, and/or about 0% to about 65% by weight of the puff base material. Each of the exemplary puff transfer compositions may be made using the same or similar manufacturing equipment and conditions.

The puff base material is adapted to provide puff characteristics, and it is suitable for use with puff transfer applications. Accordingly, the puff base material may be any puff base that is conventional, suitable, or commercially available now or in the future. Examples of the puff base material include, but are not limited to, the TF 10480 neutral base and the XDG49234BD neutral base which are available from Wilflex Inc. and other similar, suitable, or conventional puff base materials. It is believed that the puff base TF 10480 is comprised of resin, base, adhesive, and blowing agent. It is believed that the XDG49234BD neutral base is also comprised of resin, base, adhesive, and blowing agent.

The pigment concentrate may be any suitable, conventional, or commercially available pigment concentrate. Examples of the pigment concentrate include, but are not limited to, pigment concentrates that are commercially available from Wilflex Inc. and other similar, suitable, or conventional pigment concentrates. In the present invention, pigment concentrate is preferably used in the puff transfer composition instead of plastisol ink. As noted above, plastisol ink contains other ingredients in addition to the pigment concentrate. The additional ingredients in the plastisol ink can be detrimental to the quality of the puff. Most importantly, the additional ingredients can hold down the puff and cause the puff to collapse. For similar reasons, it may be desired to limit the amount of pigment concentrate in the puff transfer compositions as noted above.

The transfer base material may be any suitable, conventional, or commercially available base material that is adapted for use with transfer applications. An example of the transfer base material includes, but is not limited to, the TF 10440 neutral base which is available from Wilflex Inc. and other similar, suitable, or conventional transfer base materials. It is believed that the transfer base TF 10440 is comprised of resin and plasticizer.

Various manufacturing considerations can affect the quality of the puff. The inventors have discovered that the size of the mesh can influence the millage, i.e., thickness of the puff. The puff preferably has a millage of at least about 2.5 mils, more preferably at least about 3.0 mils, still more preferably at least about 4.0 mils, and even more preferably at least about 5.0 mils. It is preferred to use mesh size 40 T or coarser to obtain optimal millage. Accordingly, a puff transfer of the present invention is particularly well-suited for images that do not require a high degree of resolution. However, optional embodiments of the present invention may use finer mesh, e.g., mesh size up to and possibly exceeding 70 T.

The drying temperature and time of the puff transfer can also determine the quality of the puff. After an ink is applied to the transfer sheet, the transfer sheet is preferably passed through a dryer to gel the ink. A belt may be used to pass the transfer sheet through the dryer. A conventional dryer may be used. An example of the dryer is a gas-fired dryer that is commercially available from S.P.E. in California. The drying temperature and time can be adjusted to suit a particular dryer temperature and belt speed. It is preferred to maintain the dryer temperature between about 225 and 320 degrees Fahrenheit (more preferably between about 250 and 280 degrees Fahrenheit) and the residence time in the dryer to between about 10 and 35 seconds. However, it should be noted that the dryer temperature and residence time may varied outside of these ranges to obtain any desired characteristics of the puff.

The completed transfer may be heat applied to clothing or other items using conventional transfer presses. Examples of a transfer press include, but are not limited to, a commercially available Sakauri Cylinder press, a hand bench press, or any other similar, suitable, or conventional transfer press. Satisfactory results may be obtained using a press temperature of about 375–395° F., a platen pressure of about 45–60 psi, and a dwell time of about 4–15 seconds.

EXAMPLE

An image was made using TF 19000 Black, Pantone Orange 021 C, Pantone Violet C, Pantone 339 C, Pantone 300 C, Pantone 185 C, and Pantone Yellow C. The TF 19000 Black was applied to the transfer sheet using a 160 T mesh screen, and the other inks were each applied using a respective 40 T mesh screen. In particular, the following puff transfer compositions were used in addition to the TF 19000 Black to make the image:

| Pantone Orange 021 C | |
|---|---|
| TF 10480 Puff Base | 4000 grams |
| PCM Yellow | 225 grams |
| PCM Red | 25 grams |
| Pantone Violet C | |
| TF 10480 Puff Base | 4000 grams |
| PCM Violet | 100 grams |
| PCM Fluorescent Purple | 50 grams |
| Pantone 339 C | |
| TF 10480 Puff Base | 4000 grams |
| PCM Green | 250 grams |
| PCM Blue | 25 grams |
| PCM Fluorescent Yellow | 10 grams |
| Pantone 300 C | |
| TF 10480 Puff Base | 4000 grams |

-continued

| PCM Blue | 100 grams |
|---|---|
| PCM Fluorescent Blue | 80 grams |
| Pantone 185 C | |
| TF 10480 Puff Base | 4000 grams |
| PCM Red | 150 grams |
| PCM Yellow | 35 grams |
| PCM Fluorescent Pink | 25 grams |
| Pantone Yellow C | |
| TF 10480 Puff Base | 4000 grams |
| PCM Yellow | 175 grams |

EXAMPLE

An image was made using TF 19000 Black, Pantone Orange 021 C, Pantone 224 C, Pantone 264 C, Pantone 360 C, Pantone 324 C, Pantone 381 C, and Pantone 136 C. The TF 19000 Black was applied to the transfer sheet using a 160 T mesh screen, and the other inks were each applied using a respective 40 T mesh screen. In particular, the following puff transfer compositions were used in addition to the TF 19000 Black to make the image:

| Pantone Orange 021 C | |
|---|---|
| TF 10480 Puff Base | 4000 grams |
| PCM Yellow | 225 grams |
| PCM Red | 25 grams |
| Pantone 224 C | |
| TF 10480 Puff Base | 4000 grams |
| PCM White | 60 grams |
| PCM Magenta | 30 grams |
| PCM Fluorescent Pink | 50 grams |
| Pantone 264 C | |
| TF 10480 Puff Base | 4000 grams |
| PCM White | 140 grams |
| PCM Violet | 15.7 grams |
| PCM Fluorescent Pink | 2.5 grams |
| Pantone 360 C | |
| TF 10480 Puff Base | 4000 grams |
| PCM White | 100 grams |
| PCM Yellow | 180 grams |
| PCM Green | 35 grams |
| PCM Blue | 1 gram |
| Pantone 324 C | |
| TF 10480 Puff Base | 4000 grams |
| PCM White | 145 grams |
| PCM Green | 9 grams |
| PCM Black | 1 gram |
| PCM Fluorescent Yellow | 2 grams |
| Pantone 381 C | |
| TF 10480 Puff Base | 4000 grams |
| PCM White | 96 grams |
| PCM Yellow | 170 grams |
| PCM Green | 20 grams |
| PCM Fluorescent Yellow | 10 grams |
| Pantone 136 C | |
| TF 10480 Puff Base | 4000 grams |
| PCM White | 106 grams |
| PCM Yellow | 125 grams |
| PCM Red | 5 grams |
| PCM Marine | 1 gram |

EXAMPLE

An image was made using TF 19000 Black, Pantone 1355 C, Pantone 264 C, Pantone 3242 C, Pantone 2905 C, Pantone 182 C, and Pantone 100 C. The TF 19000 Black was applied to the transfer sheet using a 160 T mesh screen, and the other inks were each applied using a respective 40 T mesh screen. In particular, the following puff transfer compositions were used in addition to the TF 19000 Black to make the image:

| Pantone 1355 C | |
| --- | --- |
| TF 10480 Puff Base | 4000 grams |
| PCM White | 140 grams |
| PCM Yellow | 56 grams |
| PCM Magenta | 8.9 grams |
| PCM Marine | 1.5 grams |
| Pantone 264 C | |
| TF 10480 Puff Base | 4000 grams |
| PCM White | 140 grams |
| PCM Violet | 29.5 grams |
| PCM Fluorescent Pink | 4 grams |
| Pantone 3242 C | |
| TF 10480 Puff Base | 4000 grams |
| PCM White | 170 grams |
| PCM Green | 20 grams |
| PCM Blue | 1.5 grams |
| PCM Fluorescent Yellow | 3.5 grams |
| Pantone 2905 C | |
| TF 10480 Puff Base | 4000 grams |
| PCM White | 140 grams |
| PCM Marine | 45 grams |
| PCM Blue | 4 grams |
| PCM Fluorescent Yellow | 5.5 grams |
| Pantone 182 C | |
| TF 10480 Puff Base | 4000 grams |
| PCM White | 140 grams |
| PCM Fluorescent Yellow | 25 grams |
| PCM Red | 11.5 grams |
| PCM Fluorescent Blue | 1 gram |
| Pantone 100 C | |
| TF 10480 Puff Base | 4000 grams |
| PCM White | 140 grams |
| PCM Yellow | 30 grams |

EXAMPLE

Puff transfers were made according to the present invention using a 40 T mesh. The image was comprised of the following colors: Pantone Violet C, Pantone Process Blue C, Pantone Green C, Pantone Red 032 C, Pantone Yellow C, and Pantone Orange 021 C. All of the inks were mixed with no more than 15% by weight pigment concentrate loads. Each transfer sheet was Burkhardt/Freeman 31×45 ultra strip smooth treated C2S 65 pounds, lot number 39614. After the application of each ink, the respective transfer sheet was passed through a 280 degree Fahrenheit gas-fired dryer for about 26 seconds on a belt travelling at a speed of about 46 feet per minute. Drying and stacking of the transfers was successful. One of the completed transfers was then applied to a piece of clothing using a Sakauri Cylinder Press. The transferred image had a millage of about 5.0 to 5.25 while still wet.

EXAMPLE

A second transfer was manufactured under the same conditions as described in the above example. However, in this example, a transfer was applied with a hand bench press to an article of clothing. While still wet, the transferred image had a millage of about 3 to about 3.25.

EXAMPLE

In this example, a 40 T mesh was used in the application of the inks to the transfer sheet. The dryer temperature was about 280 degrees Fahrenheit, and the belt speed was increased to 65 feet per minute. Accordingly, the residence time in the dryer was decreased to about 18.5 seconds. The image was transferred to an article of clothing using a Sakauri Cylinder Press. This resulted in a puff image having a thickness of about 5.25 mils.

EXAMPLE

An image was made using Pantone 021 C, Pantone 224 C, Pantone 264 C, Pantone 360 C, Pantone 3105 C, Pantone 381 C, and Pantone 136 C. In contrast to the previous examples, each of the pigment concentrates were first mixed together with the transfer ink base material. Thereafter, the puff base material was added to the mix. The transfer was made using the same or similar manufacturing conditions and techniques as described above. The resultant transfer exhibited puff characteristics that were the same or similar as those described above. Moreover, the inventors surprisingly discovered that the combination of the transfer base material (TF 10440) and the puff base material (XDG49234BD) resulted in a transfer composition that exhibited improved printing and washing characteristics. The transfer was easier to print, and the transfer maintained its integrity better in the wash.

| Pantone 021 C | |
| --- | --- |
| TF 10440 Base | 1500 grams |
| PCM Red | 25 grams |
| PCM Yellow | 70 grams |
| XDG49234BD Puff Base | 2000 grams |
| Pantone 224 C | |
| TF 10440 Base | 1500 grams |
| PCM White | 40 grams |
| PCM Magenta | 15 grams |
| PCM Fluorescent Pink | 20 grams |
| XDG49234BD Puff Base | 2000 grams |
| Pantone 264 C | |
| TF 10440 Base | 1500 grams |
| PCM White | 80 grams |
| PCM Violet | 12 grams |
| PCM Fluorescent Pink | 3 grams |
| XDG49234BD Puff Base | 2000 grams |
| Pantone 360 C | |
| TF 10440 Base | 1500 grams |
| PCM White | 60 grams |
| PCM Blue | 1 gram |
| PCM Green | 20 grams |
| PCM Yellow | 120 grams |
| XDG49234BD Puff Base | 2000 grams |
| Pantone 3105 C | |
| TF 10440 Base | 1500 grams |
| PCM White | 70 grams |
| PCM Blue | 6 grams |
| PCM Green | 8 grams |
| XDG49234BD Puff Base | 2000 grams |
| Pantone 381 C | |
| TF 10440 Base | 1500 grams |
| PCM White | 66 grams |
| PCM Green | 12 grams |
| PCM Yellow | 110 grams |
| PCM Fluorescent Chartreuse | 15 grams |
| XDG49234BD Puff Base | 2000 grams |

-continued

| Pantone 136 C | |
|---|---|
| TF 10440 Base | 1500 grams |
| PCM White | 65 grams |
| PCM Red | 5 grams |
| PCM Marine | 0.25 gram |
| PCM Yellow | 80 grams |
| XDG49234BD Puff Base | 2000 grams |

EXAMPLE

An image was made using Pantone 021 C, Pantone Violet C, Pantone 339 C, Pantone 300 C, Pantone 185 C, and Pantone Yellow C. Each of the pigment concentrates was first mixed together with the transfer ink base material. Thereafter, the puff base material was added to the mix. The transfer was made using the same or similar manufacturing conditions and techniques as described above. The resultant transfer exhibited puff characteristics that were the same or similar as those described above. Moreover, the combination of the transfer base material (TF 10440) and the puff base material (XDG49234BD) resulted in a transfer composition that again exhibited improved printing and washing characteristics. The transfer was easier to print, and the transfer maintained its integrity better in the wash.

| Pantone 021 C | |
|---|---|
| TF 10440 Base | 1500 grams |
| PCM Red | 25 grams |
| PCM Yellow | 70 grams |
| XDG49234BD Puff Base | 2000 grams |
| Pantone Violet C | |
| TF 10440 Base | 1500 grams |
| PCM Violet | 66 grams |
| PCM Fluorescent Purple | 30 grams |
| XDG49234BD Puff Base | 2000 grams |
| Pantone 339 C | |
| TF 10440 Base | 1500 grams |
| PCM Blue | 16 grams |
| PCM Green | 160 grams |
| PCM Fluorescent Chartreuse | 10 grams |
| XDG49234BD Puff Base | 2000 grams |
| Pantone 300 C | |
| TF 10440 Base | 1500 grams |
| PCM Blue | 70 grams |
| PCM Fluorescent Blue | 50 grams |
| XDG49234BD Puff Base | 2000 grams |
| Pantone 185 C | |
| TF 10440 Base | 1500 grams |
| PCM Red | 150 grams |
| PCM Yellow | 16 grams |
| PCM Fluorescent Pink | 16 grams |
| XDG49234BD Puff Base | 2000 grams |
| Pantone Yellow C | |
| TF 10440 Base | 1500 grams |
| PCM Yellow | 110 grams |
| XDG49234BD Puff Base | 2000 grams |

EXAMPLE

An image was made using Pantone 193 C, Pantone 258 C, Pantone 363 C, Pantone 457 C, Pantone 465 C, and Pantone 542 C. Each of the pigment concentrates was first mixed together with the transfer ink base material. Thereafter, the puff base material was added to the mix. The transfer was made using the same or similar manufacturing conditions and techniques as described above. This resultant transfer also exhibited puff characteristics that were the same or similar as those described above. Again, the combination of the transfer base material (TF 10440) and the puff base material (XDG49234BD) resulted in a transfer composition that exhibited improved printing and washing characteristics. The transfer was easier to print, and the transfer maintained its integrity better in the wash.

| Pantone 193 C | |
|---|---|
| TF 10440 Base | 1500 grams |
| PCM White | 30 grams |
| PCM Magenta | 100 grams |
| PCM Red | 200 grams |
| PCM Black | 1 gram |
| XDG49234BD Puff Base | 2000 grams |
| Pantone 258 C | |
| TF 10440 Base | 1500 grams |
| PCM White | 391 grams |
| PCM Magenta | 165 grams |
| PCM Marine | 103 grams |
| XDG49234BD Puff Base | 2000 grams |
| Pantone 363 C | |
| TF 10440 Base | 1500 grams |
| PCM White | 200 grams |
| PCM Blue | 38 grams |
| PCM Yellow | 270 grams |
| PCM Black | 1.5 grams |
| XDG49234BD Puff Base | 2000 grams |
| Pantone 457 C | |
| TF 10440 Base | 1500 grams |
| PCM White | 20 grams |
| PCM Red | 3 grams |
| PCM Marine | 15 grams |
| PCM Yellow | 300 grams |
| PCM Black | 1 gram |
| XDG49234BD Puff Base | 2000 grams |
| Pantone 465 C | |
| TE 10440 Base | 1500 grams |
| PCM White | 550 grams |
| PCM Magenta | 4 grams |
| PCM Violet | 10 grams |
| PCM Yellow | 45 grams |
| PCM Black | 1 gram |
| XDG49234BD Puff Base | 2000 grams |
| Pantone 542 C | |
| TF 10440 Base | 1500 grams |
| PCM White | 520 grams |
| PCM Marine | 280 grams |
| PCM Blue | 12 grams |
| PCM Black | 8 grams |
| XDG49234BD Puff Base | 2000 grams |

EXAMPLE

An image was made using Pantone 801 C, Pantone 802 C, Pantone 803 C, Pantone 804 C, Pantone 805 C, and Pantone 807 C. Each of the pigment concentrates was first mixed together with the transfer ink base material and then loaded into the puff base material. The transfer was made using the same or similar manufacturing conditions and techniques as described above. The resultant transfer exhibited puff characteristics that were the same or similar as those described above. Moreover, the combination of the transfer base material (TF 10440) and the puff base material (XDG49234BD) resulted in a transfer composition that again exhibited improved printing and washing characteristics. The transfer was easier to print, and the transfer maintained its integrity better in the wash.

| Pantone 801 C | |
|---|---|
| TF 10440 Base | 1500 grams |
| PCM White | 35 grams |
| PCM Blue | 20 grams |
| PCM Fluorescent Blue | 300 grams |
| XDG49234BD Puff Base | 2000 grams |
| Pantone 802 C | |
| TF 10440 Base | 1500 grams |
| PCM White | 40 grams |
| PCM Green | 5 grams |
| PCM Fluorescent Chartreuse | 20 grams |
| PCM Fluorescent Green | 40 grams |
| XDG49234BD Puff Base | 2000 grams |
| Pantone 803 C | |
| TF 10440 Base | 1500 grams |
| PCM White | 50 grams |
| PCM Yellow | 25 grams |
| PCM Fluorescent Chartreuse | 225 grams |
| PCM Fluorescent Pink | 1.5 grams |
| XDG49234BD Puff Base | 2000 grams |
| Pantone 804 C | |
| TF 10440 Base | 1500 grams |
| PCM White | 40 grams |
| PCM Red | 30 grams |
| PCM Yellow | 400 grams |
| PCM Fluorescent Pink | 90 grams |
| XDG49234BD Puff Base | 2000 grams |
| Pantone 805 C | |
| TF 10440 Base | 1500 grams |
| PCM White | 10 grams |
| PCM Red | 60 grams |
| PCM Yellow | 225 grams |
| PCM Fluorescent Pink | 325 grams |
| XDG49234BD Puff Base | 2000 grams |
| Pantone 807 C | |
| TF 10440 Base | 1500 grams |
| PCM White | 6 grams |
| PCM Violet | 6 grams |
| PCM Fluorescent Pink | 450 grams |
| XDG49234BD Puff Base | 2000 grams |

EXAMPLE

An image was made using a puff transfer composition comprising at least 25% by weight of a transfer base material, at least 65% by weight of a puff base material, and about 10% or less by weight of pigment concentrates. Each of the pigment concentrates was first mixed together with the transfer ink base material and then loaded into the puff base material. The transfer was made using the same or similar manufacturing conditions and techniques as described above. The resultant transfer exhibited puff characteristics that were the same or similar as those described above. Moreover, the combination of the transfer base material (TF 10440) and the puff base material (XDG49234BD) resulted in a transfer composition that again exhibited improved printing and washing characteristics. The transfer was easier to print, and the transfer maintained its integrity better in the wash.

The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to affect the described invention. Many of those variations and modifications will provide the same result and fall within the spirit of the claimed invention. It is the intention, therefore, to limit the invention only as indicated by the scope of the claims.

What is claimed is:

1. A transfer composition comprising:
   a transfer base material in an amount of at least about 25% by weight;
   a puff base material in an amount of at least about 65% by weight; and
   at least one pigment concentrate in a total amount of about 10% by weight or less.

2. The transfer composition of claim 1 wherein said puff base material is comprised of a resin, a base, an adhesive, and a blowing agent.

3. The transfer composition of claim 1 wherein said transfer base material is comprised of a resin and a plasticizer.

4. A transfer composition comprising:
   a transfer base material in an amount of at least about 25% by weight;
   a puff base material in an amount of at least about 35% by weight; and
   at least one pigment concentrate in a total amount of about 40% by weight or less.

5. The transfer composition of claim 4 wherein said puff base material is comprised of a resin, a base, an adhesive, and a blowing agent.

6. The transfer composition of claim 4 wherein said transfer base material is comprised of a resin and a plasticizer.

7. A transfer comprising:
   a sheet of substrate treated with a stearato-chromic chloride complex release coating; and
   an ink image on said sheet, said ink image made of a composition including a transfer base material, a cuff base material, and at least one pigment concentrate;
   wherein said transfer base material is in an amount of at least about 25% by weight of said composition;
   wherein said puff base material is in an amount of at least about 65% by weight of said composition; and
   wherein said pigment concentrate is in a total amount of about 10% by weight or less of said composition.

8. A transfer comprising:
   a sheet of substrate treated with a stearato-chromic chloride complex release coating; and
   an ink image on said sheet, said ink image made of a composition including a transfer base material, a puff base material, and at least one pigment concentrate;
   wherein said transfer base material is in an amount of at least about 25% by weight of said composition;
   wherein said puff base material is in an amount of at least about 35% by weight of said composition; and
   wherein said pigment concentrate is in a total amount of about 40% by weight or less of said composition.

9. A method for making a puff image on a fabric article, said method comprising the steps of:
   providing a puff base plastisol material;
   providing a transfer base material;
   providing at least three pigment concentrates;
   separately mixing a combination of said puff base plastisol material and said transfer base material with each of said pigment concentrates to form at least three transfer compositions;

screen printing said transfer compositions on a substrate to form a transfer;

positioning said transfer on a fabric article; and applying heat and pressure to said substrate to transfer said transfer compositions onto said fabric article;

wherein said transfer compositions are adapted to puff.

10. The method of claim 9 wherein each of said transfer compositions are comprised of:

said transfer base material in an amount of at least about 25% by weight;

said puff base plastisol material in an amount of at least about 65% by weight; and said pigment concentrates in a total amount of about 10% by weight or less.

11. The method of claim 9 wherein said screen printing step includes a step of transferring said transfer compositions through a screen of about 70 T mesh or coarser.

12. The method of claim 11 wherein said screen is about 40 T mesh or coarser.

13. The method of claim 9 wherein a thickness of said transfer compositions after said transfer compositions have been transferred onto said fabric article is at least about 2.25 mils.

14. The method of claim 13 wherein said thickness of said transfer compositions after said transfer compositions have been transferred onto said fabric article is at least about 3.0 mils.

15. The method of claim 14 wherein said thickness of said transfer compositions after said transfer compositions have been transferred onto said fabric article is at least about 4.0 mils.

16. The method of claim 15 wherein said thickness of said transfer compositions after said transfer compositions have been transferred onto said fabric article is at least about 5.0 mils.

17. The method of claim 9 wherein said substrate is treated with a stearato-chromic chloride complex release coating.

18. The method of claim 9 wherein each of said pigment concentrates are of different colors.

19. The method of claim 18 wherein the method further includes, after the screen printing step, the step of drying the transfer compositions on the substrate.

20. The method of claim 19 wherein the drying step includes the step of heating the transfer compositions on the substrate in a dryer set at a temperature of about 225° F. to about 320° F. for about 10 to about 35 seconds.

21. The method of claim 19 wherein the drying step is performed for each of the transfer compositions deposited on the substrate.

22. The method of claim 21 wherein the drying step for each of the transfer compositions is performed prior to screen printing the next transfer composition on the substrate.

23. The method of claim 9 wherein the screen printing step deposits said transfer compositions on the substrate in a single layer.

24. A method for making a multi-color puff heat transfer adapted to be transferred to a target substrate, comprising the steps of:

(a) mixing a first plastisol base material that includes a blowing agent with a first transfer base material and a first pigment concentrate to form a first transfer composition;

(b) screen printing the first transfer composition on a transfer substrate;

(c) following the screen printing step (b), drying the first transfer composition on the transfer substrate;

(d) mixing a next plastisol base material that includes a blowing agent with a next transfer base material and a next pigment concentrate to form a next transfer composition;

(e) following the drying step (c), screen printing the next transfer composition on the transfer substrate;

(f) following the screen printing step (e), drying the next transfer composition on the transfer substrate; and (g) following the drying step (f), repeating steps (d)–(f) to produce a heat-transfer with at least three colors.

25. The method of claim 24, wherein the drying steps include the step of heating the transfer substrate and transfer compositions deposited thereon for a period of about 10 to about 35 seconds at a temperature of about 225° F. to about 320° F.

26. The method of claim 24, wherein the screen printing steps collectively deposit the transfer compositions on the transfer substrate in a single layer.

27. A multi-color puff heat transfer adapted to be transferred to a target substrate prepared by a process that comprises the steps of:

(a) mixing a first plastisol base material that includes a blowing agent with a first transfer base material and a first pigment concentrate to form a first transfer composition;

(b) screen printing the first transfer composition on a transfer substrate;

(c) following the screen printing step (b), drying the first transfer composition on the transfer substrate;

(d) mixing a next plastisol base material that includes a blowing agent with a next transfer base material and a next pigment concentrate to form a next transfer composition;

(e) following the drying step (c), screen printing the next transfer composition on the transfer substrate;

(f) following the screen printing step (e), drying the next transfer composition on the transfer substrate; and (g) following the drying step (f), repeating steps (d)–(f) to produce a heat-transfer with at least three colors.

* * * * *